(12) United States Patent
Kottapalli et al.

(10) Patent No.: US 9,911,470 B2
(45) Date of Patent: Mar. 6, 2018

(54) FAST-BYPASS MEMORY CIRCUIT

(75) Inventors: Venkata Kottapalli, Fremont, CA (US); Scott Pitkethly, San Francisco, CA (US); Christian Klingner, Sunnyvale, CA (US); Matthew Gerlach, Plymouth, MI (US)

(73) Assignee: NVIDIA CORPORATION, Santa Clara, CA (US)

( * ) Notice: Subject to any disclaimer, the term of this patent is extended or adjusted under 35 U.S.C. 154(b) by 563 days.

(21) Appl. No.: 13/447,037

(22) Filed: Apr. 13, 2012

(65) Prior Publication Data

US 2013/0155783 A1  Jun. 20, 2013

Related U.S. Application Data

(63) Continuation-in-part of application No. 13/327,693, filed on Dec. 15, 2011, now Pat. No. 8,848,458.

(51) Int. Cl.
   *G11C 7/10* (2006.01)
   *H03K 3/012* (2006.01)

(52) U.S. Cl.
   CPC .......... *G11C 7/1072* (2013.01); *H03K 3/012* (2013.01)

(58) Field of Classification Search
   CPC .................................................. G11C 21/00
   USPC ....... 365/49.11, 76, 77, 78, 189.011, 189.02, 365/189.05, 230.01, 230.08, 233.1
   See application file for complete search history.

(56) References Cited

U.S. PATENT DOCUMENTS

| | | |
|---|---|---|
| 3,178,590 A | 4/1965 | Heilweil |
| 3,241,122 A | 3/1966 | Bardell, Jr. |
| 3,381,232 A | 4/1968 | Hoernes |
| 3,413,557 A | 11/1968 | Muhlenbruch |
| 3,474,262 A | 10/1969 | Turcotte |
| 4,256,411 A | 3/1981 | Podosek |
| 5,032,708 A * | 7/1991 | Comerford et al. .......... 235/492 |
| 5,262,973 A | 11/1993 | Richardson |
| 5,305,258 A | 4/1994 | Koshizuka |
| 5,349,255 A * | 9/1994 | Patel ............................ 327/141 |
| 5,422,805 A | 6/1995 | McIntyre et al. |
| 5,586,069 A | 12/1996 | Dockser |
| 5,586,081 A * | 12/1996 | Mills ................... G06F 12/0607 365/230.02 |

(Continued)

FOREIGN PATENT DOCUMENTS

JP     2004214997     7/2004

OTHER PUBLICATIONS

Weste, Neil H.E., and David Money Harris. CMOS VLSI Design: A Circuits and Systems Perspective. 2011. Addison-Wesley. 4th Ediition. Chapter 1, pp. 1-61.*

(Continued)

*Primary Examiner* — Uyen B Tran

(57) ABSTRACT

A memory circuit that presents input data at a data output promptly on receiving a clock pulse includes upstream and downstream memory logic and selection logic. The upstream memory logic is configured to latch the input data on receiving the clock pulse. The downstream memory logic is configured to store the latched input data. The selection logic is configured to expose a logic level dependent on whether the upstream memory logic has latched the input data, the exposed logic level derived from the input data before the input data is latched, and from the latched input data after the input data is latched.

20 Claims, 12 Drawing Sheets

(56) References Cited

U.S. PATENT DOCUMENTS

| | | | |
|---|---|---|---|
| 5,600,598 A | 2/1997 | Skjaveland et al. | |
| 5,604,689 A | 2/1997 | Dockser | |
| 5,615,113 A | 3/1997 | Matula | |
| 5,638,312 A | 6/1997 | Simone | |
| 5,694,355 A | 12/1997 | Skjaveland et al. | |
| 5,748,515 A | 5/1998 | Glass et al. | |
| 5,821,791 A | 10/1998 | Gaibotti et al. | |
| 5,835,941 A | 11/1998 | Pawlowski | |
| 5,867,443 A | 2/1999 | Linderman | |
| 5,870,329 A | 2/1999 | Foss | |
| 5,903,171 A | 5/1999 | Shieh | |
| 5,949,706 A | 9/1999 | Chang et al. | |
| 6,009,451 A | 12/1999 | Burns | |
| 6,041,008 A | 3/2000 | Marr | |
| 6,055,590 A | 4/2000 | Pettey et al. | |
| 6,084,856 A | 7/2000 | Simmons et al. | |
| 6,125,064 A * | 9/2000 | Kim | G11C 7/1051 365/189.05 |
| 6,163,500 A | 12/2000 | Wilford et al. | |
| 6,173,303 B1 | 1/2001 | Avigdor et al. | |
| 6,263,331 B1 | 7/2001 | Liu et al. | |
| 6,263,410 B1 | 7/2001 | Kao et al. | |
| 6,265,922 B1 | 7/2001 | Kirsch | |
| 6,300,809 B1 | 10/2001 | Gregor et al. | |
| 6,304,505 B1 | 10/2001 | Forbes et al. | |
| 6,310,501 B1 | 10/2001 | Yamashita | |
| 6,366,529 B1 | 4/2002 | Williams | |
| 6,396,309 B1 | 5/2002 | Zhao et al. | |
| 6,400,735 B1 | 6/2002 | Percey | |
| 6,438,024 B1 | 8/2002 | Gold et al. | |
| 6,442,721 B2 | 8/2002 | Whetsel | |
| 6,452,433 B1 * | 9/2002 | Chang | H03K 3/0372 327/201 |
| 6,472,920 B1 | 10/2002 | Cho et al. | |
| 6,501,677 B1 | 12/2002 | Rau et al. | |
| 6,580,411 B1 | 6/2003 | Kubota et al. | |
| 6,630,853 B1 | 10/2003 | Hamada | |
| 6,646,938 B2 | 11/2003 | Kodama | |
| 6,714,060 B2 | 3/2004 | Araki | |
| 6,747,485 B1 | 6/2004 | Suryanarayana et al. | |
| 6,803,610 B2 | 10/2004 | Koolhaas et al. | |
| 6,842,059 B1 * | 1/2005 | Wu | 327/199 |
| 6,885,589 B2 | 4/2005 | Cioaca | |
| 6,924,683 B1 * | 8/2005 | Hayter | H03K 3/012 327/212 |
| 6,987,775 B1 | 1/2006 | Haywood | |
| 7,051,169 B2 | 5/2006 | Ganton | |
| 7,057,421 B2 | 6/2006 | Shi et al. | |
| 7,106,098 B1 | 9/2006 | Zack et al. | |
| 7,111,133 B2 | 9/2006 | Ishikawa et al. | |
| 7,196,552 B2 | 3/2007 | Zhou | |
| 7,227,798 B2 | 6/2007 | Gupta et al. | |
| 7,242,235 B1 * | 7/2007 | Nguyen | H03K 3/0372 327/210 |
| 7,283,404 B2 | 10/2007 | Khan et al. | |
| 7,304,903 B2 | 12/2007 | Mukhopadhyay et al. | |
| 7,333,516 B1 * | 2/2008 | Sikkink | H04L 7/0012 370/503 |
| 7,346,861 B1 | 3/2008 | Lee | |
| 7,405,606 B2 | 7/2008 | Kok et al. | |
| 7,408,393 B1 * | 8/2008 | Jain | H03K 3/0372 327/202 |
| 7,414,903 B2 | 8/2008 | Noda | |
| 7,418,641 B2 | 8/2008 | Drake et al. | |
| 7,498,850 B2 | 3/2009 | Hendrickson | |
| 7,499,347 B2 | 3/2009 | Chen et al. | |
| 7,603,246 B2 | 10/2009 | Newcomb et al. | |
| 7,613,030 B2 | 11/2009 | Iwata et al. | |
| 7,724,606 B2 | 5/2010 | Osawa et al. | |
| 7,739,538 B2 | 6/2010 | Fee et al. | |
| 7,760,117 B1 | 7/2010 | Chou | |
| 7,783,911 B2 | 8/2010 | Chen et al. | |
| 8,164,934 B2 | 4/2012 | Watanabe et al. | |
| 8,330,517 B1 | 12/2012 | Cline | |
| 8,332,957 B2 | 12/2012 | Hayasaka | |
| 8,352,530 B2 | 1/2013 | Dao et al. | |
| 8,363,492 B2 | 1/2013 | Ishino et al. | |
| 8,369,177 B2 | 2/2013 | Hold et al. | |
| 8,453,096 B2 | 5/2013 | Magee et al. | |
| 8,488,360 B2 | 7/2013 | Okuda | |
| 8,565,034 B1 | 10/2013 | Lu et al. | |
| 8,570,818 B2 | 10/2013 | Jung et al. | |
| 8,742,796 B2 | 6/2014 | Dally et al. | |
| 8,760,208 B2 | 6/2014 | Dike et al. | |
| 8,830,766 B2 | 9/2014 | Sahu | |
| 8,848,458 B2 | 9/2014 | Kottapalli et al. | |
| 8,908,449 B1 | 12/2014 | Ramaraju | |
| 8,964,457 B2 | 2/2015 | Liaw | |
| 9,496,047 B2 | 11/2016 | Yang et al. | |
| 2002/0089364 A1 | 7/2002 | Goldgeisser et al. | |
| 2003/0025217 A1 | 2/2003 | Song | |
| 2003/0117170 A1 | 6/2003 | Meneghini | |
| 2003/0120886 A1 | 6/2003 | Moller et al. | |
| 2003/0123320 A1 * | 7/2003 | Wright et al. | 365/233 |
| 2003/0156461 A1 * | 8/2003 | Demone | G11C 7/065 365/189.05 |
| 2003/0210078 A1 | 11/2003 | Wijetunga et al. | |
| 2004/0027184 A1 | 2/2004 | Araki | |
| 2004/0160244 A1 | 8/2004 | Kim | |
| 2004/0243896 A1 | 12/2004 | Jaber et al. | |
| 2005/0040856 A1 | 2/2005 | Ramaraju et al. | |
| 2005/0108604 A1 | 5/2005 | Wong | |
| 2005/0128844 A1 | 6/2005 | Yamagami | |
| 2006/0049852 A1 | 3/2006 | Park et al. | |
| 2006/0132209 A1 | 6/2006 | Meltzer et al. | |
| 2006/0136656 A1 | 6/2006 | Conley et al. | |
| 2007/0028157 A1 | 2/2007 | Drake et al. | |
| 2007/0130242 A1 | 6/2007 | Tajiri | |
| 2007/0146033 A1 | 6/2007 | Pesci | |
| 2007/0180006 A1 | 8/2007 | Gyoten et al. | |
| 2007/0253263 A1 | 11/2007 | Noda | |
| 2008/0086667 A1 | 4/2008 | Chen et al. | |
| 2008/0195337 A1 | 8/2008 | Agarwal et al. | |
| 2008/0270862 A1 | 10/2008 | Drake et al. | |
| 2009/0040848 A1 * | 2/2009 | Nitta | 365/194 |
| 2009/0119631 A1 | 5/2009 | Cortadella et al. | |
| 2009/0168499 A1 | 7/2009 | Kushida et al. | |
| 2010/0102890 A1 | 4/2010 | Stratz et al. | |
| 2010/0109707 A1 | 5/2010 | Srivastava et al. | |
| 2010/0174877 A1 | 7/2010 | Yagihashi | |
| 2010/0306426 A1 | 12/2010 | Boonstra et al. | |
| 2010/0332924 A1 | 12/2010 | Ziaja et al. | |
| 2011/0040906 A1 | 2/2011 | Chung et al. | |
| 2011/0066904 A1 | 3/2011 | Lackey | |
| 2011/0168875 A1 | 7/2011 | Okuda | |
| 2012/0147680 A1 | 6/2012 | Koike | |
| 2012/0163068 A1 | 6/2012 | Houston | |
| 2012/0182056 A1 | 7/2012 | Dally et al. | |
| 2013/0080491 A1 | 3/2013 | Pitkethly | |
| 2013/0080740 A1 | 3/2013 | Gentle et al. | |
| 2013/0129083 A1 | 5/2013 | Fujino | |
| 2013/0155781 A1 | 6/2013 | Kottapalli et al. | |
| 2014/0003160 A1 | 1/2014 | Trivedi et al. | |
| 2014/0056050 A1 | 2/2014 | Yang et al. | |
| 2014/0129745 A1 | 5/2014 | Alfieri | |
| 2014/0184268 A1 | 7/2014 | Alfieri et al. | |
| 2014/0244921 A1 | 8/2014 | Alfieri et al. | |
| 2014/0354330 A1 | 12/2014 | Gotterba et al. | |
| 2014/0355362 A1 | 12/2014 | Wang et al. | |
| 2015/0016183 A1 | 1/2015 | Sinangil et al. | |
| 2016/0269002 A1 | 9/2016 | Zhang et al. | |

OTHER PUBLICATIONS

Bowman, et al., "Time-Borrowing Multi-Cycle On-Chip Interconnects for Delay Variation Tolerance," Circuit Research Lab, Intel Corporation, Hillsboro, OR, Copyright 2006, ISLPED Oct. 4-6, 2006, pp. 79-84.

(56) References Cited

OTHER PUBLICATIONS

Neil H. E. Weste & David Money Harris, "CMOS VLSI Design: A circuits and Systems Perspective" 2011, Fourth Edition, Chapter 1 (book pp. 1-59), Addison-Wesley, Boston, Massachusetts.

* cited by examiner

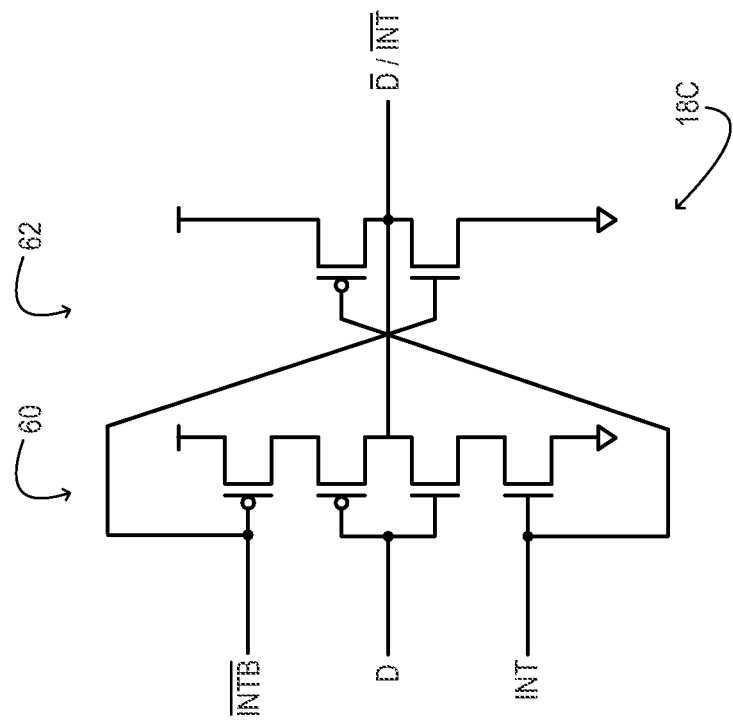
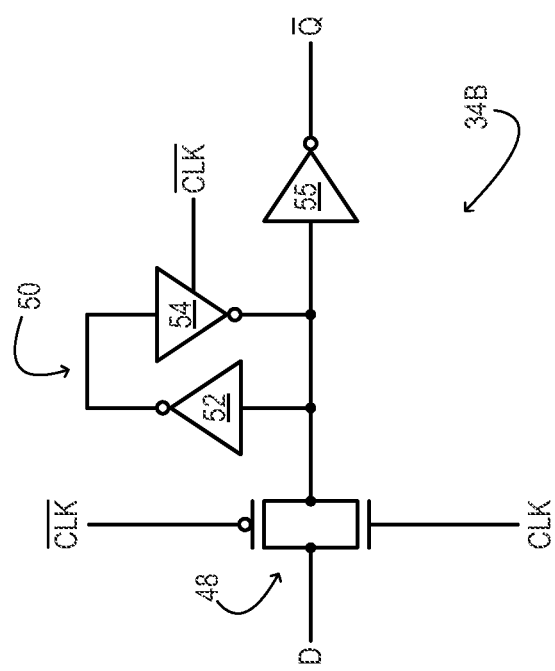
FIG. 7
FIG. 6

FAST-BYPASS MEMORY CIRCUIT

CROSS REFERENCE TO RELATED APPLICATIONS

This application is a continuation-in-part of U.S. patent application Ser. No. 13/327,693 filed 15 Dec. 2011 and entitled FAST-BYPASS MEMORY CIRCUIT, the entirety of which is hereby incorporated by reference herein for all purposes.

TECHNICAL FIELD

This patent application relates to the field of integrated-circuit (IC) engineering, and more particularly, to high-speed digital microarchitecture.

BACKGROUND

Digital data may flow through an IC via numerous logic paths. Such paths may include sequential logic—clocks, one-shots, and memory circuits such as flip-flops. In some ICs, the overall throughput of data may be limited by the data-to-output lag ($t_{DQ}$) of a memory circuit, which is a function of the data-setup time ($t_S$) and the clock-to-output lag ($t_{CQ}$). It may be desirable, therefore, to reduce both the $t_S$ and the $t_{CQ}$ of memory circuits that limit data throughput.

Furthermore, sequential logic operating at very high clock speeds may be prone to the effects of clock skew, clock jitter, and within-die delay variations, which can cause logic errors. One way to avoid such errors is to reduce the clock speed, which also reduces data throughput. A better alternative may be to implement time borrowing. Time borrowing is useful for absorbing clock skew and clock jitter and for averaging out within-die delay variations. This approach can extend the useful range of clock speed in an IC. Time-borrowing concepts may not be applicable, however, to every type of memory circuit.

Accordingly, the disclosure herein provides a novel class of memory circuit which exhibits attractively short $t_S$ and $t_{CQ}$ characteristics and is amenable to time borrowing.

BRIEF DESCRIPTION OF THE DRAWINGS

FIG. 6 schematically shows downstream memory logic in accordance with an embodiment of this disclosure.

FIG. 7 schematically shows selection logic in accordance with another embodiment of this disclosure.

DETAILED DESCRIPTION

Aspects of this disclosure will now be described by example and with reference to the illustrated embodiments listed above. Components that may be substantially the same in one or more embodiments are identified coordinately and are described with minimal repetition. It will be noted, however, that elements identified coordinately may also differ to some degree. The claims appended to this description uniquely define the subject matter claimed herein. The claims are not limited to the example structures and numerical ranges set forth below, nor to implementations that address the herein-identified problems or disadvantages of the current state of the art.

Figure 1:
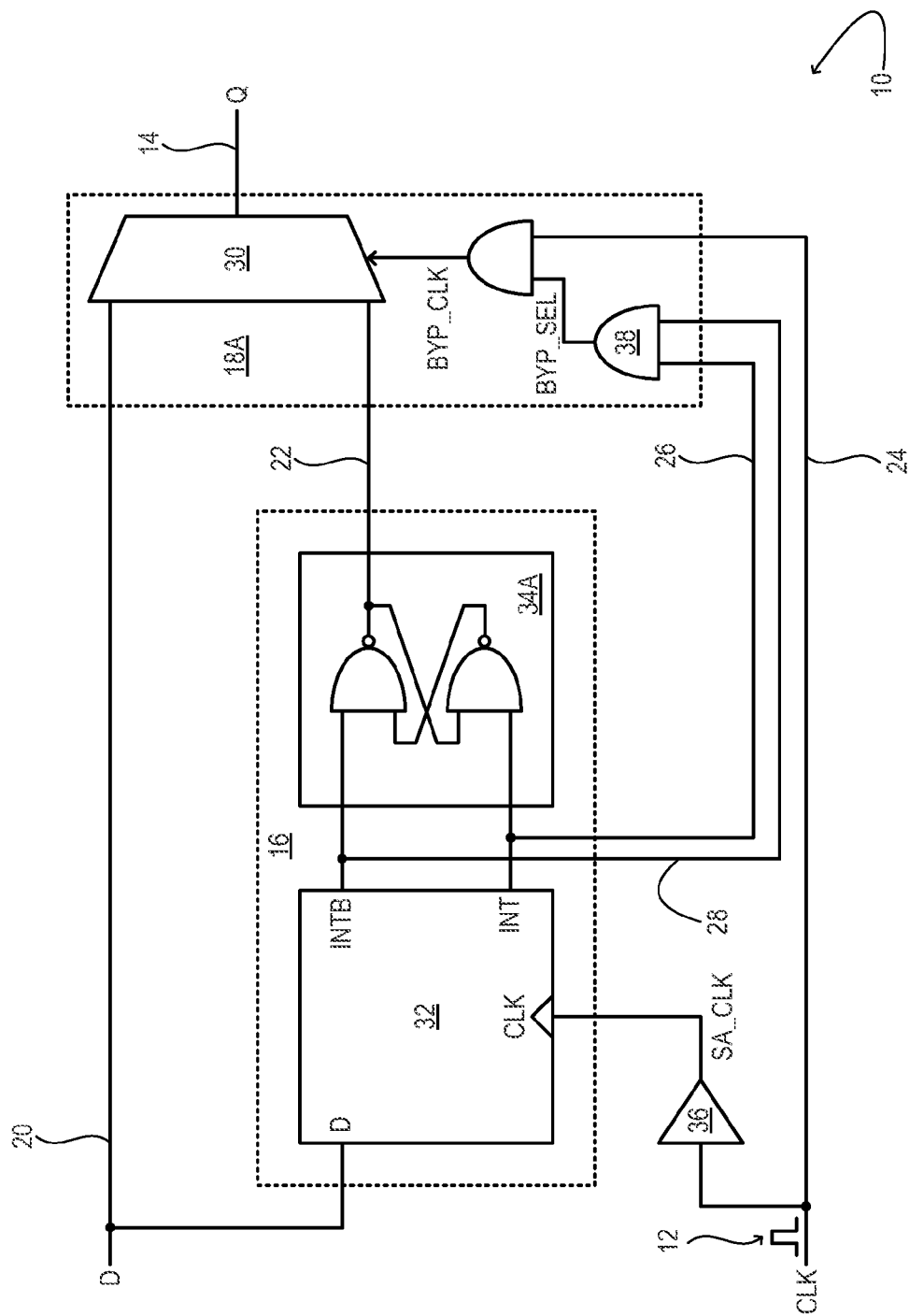
FIG. 1 schematically shows a non-transparent, fast-bypass memory circuit in accordance with an embodiment of this disclosure.

FIG. 1 schematically shows a non-transparent, fast-bypass memory circuit 10 in one embodiment. In circuit 10, a rising edge of clock pulse 12 causes input data D to appear promptly at data output 14. In some embodiments, the components of the memory circuit may be fabricated from complementary metal-oxide-semiconductor (CMOS) elements. In other embodiments, different semiconductor technologies may be used.

As described in further detail below, memory circuit 10 includes flip-flop 16, which is configured to store the input data D. In some data paths, $t_{CQ}$—the time required for input data to be stored in and propagate through the flip-flop—may be undesirably great. Therefore, memory circuit 10 also includes selection logic 18A. The selection logic forces data output 14 to the logic level of the stored data once the input data is stored—i.e., once it is fully and stably latched in the flip-flop. Before the input data is stored, the selection logic, on receiving clock pulse 12, forces the data output to the logic level of the unstored input data—20 in FIG. 1. In this manner, input data D takes a fast path to data output 14, bypassing the logic stages within flip flop 16. Accordingly, the actual clock-to-output $t_{CQ}$ for the memory circuit may be significantly less than the time required for input data to be stored in and propagate through the flip flop.

In the embodiment of FIG. 1, selection logic 18A receives a plurality of data and control inputs: data input 20, stored-data line 22, timing input 24, first control line 26, and second control line 28. Through multiplexer 30, the selection logic drives data output 14 to the logic level of the data input or of the stored-data line, depending on the state of the timing input and of the first and second control lines. In the illustrated embodiment, the timing input is driven by clock pulse 12, while the first and second control lines are driven by flip flop 16. It will be understood that the various data inputs, data lines, control lines, and outputs described herein may also be referred to as 'nodes' with no change in meaning.

Figure 2:
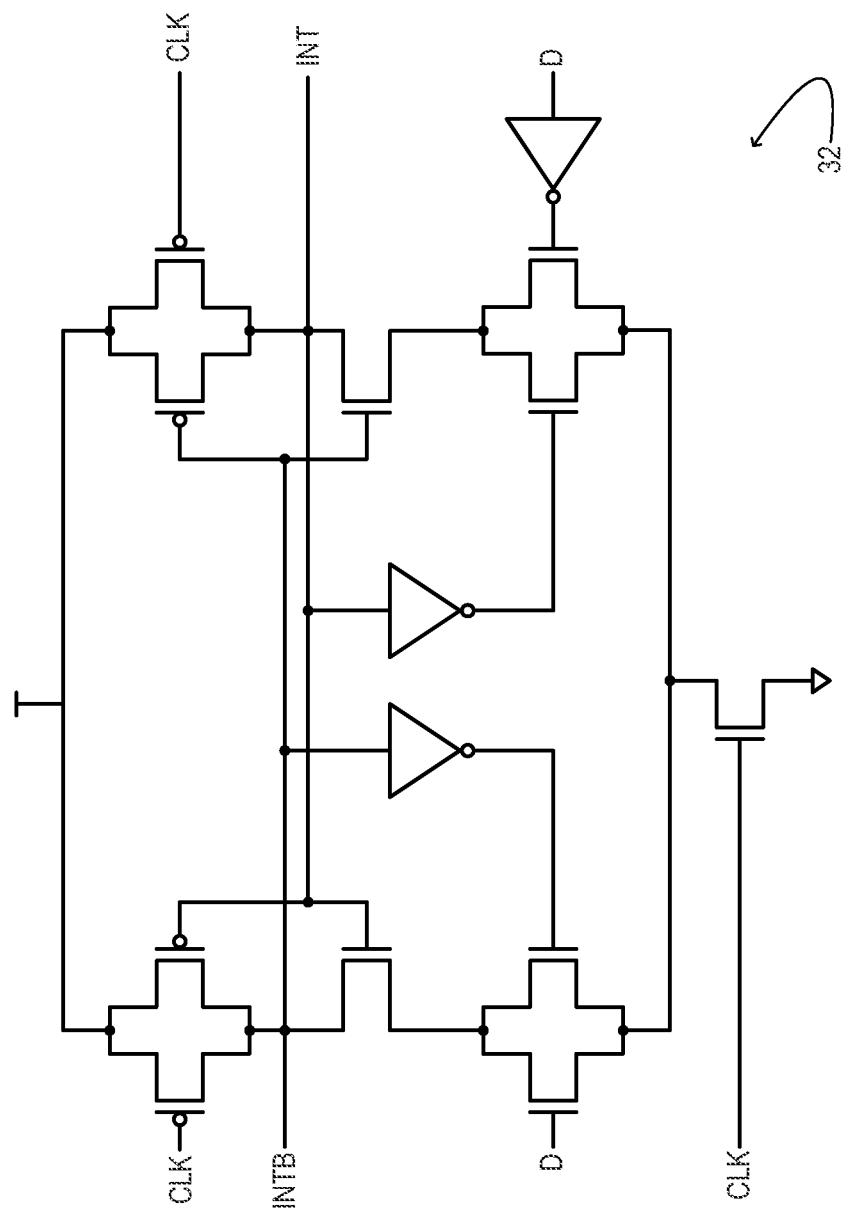
FIG. 2 schematically shows upstream memory logic of a memory circuit in accordance with an embodiment of this disclosure.

Continuing in FIG. 1, flip-flop 16 is a D-type flip flop, but other types—e.g., JK or T—are contemplated as well. Triggered by clock pulse 12, the flip-flop is configured to receive data input 20 and to drive stored-data line 22, first control line 26, and second control line 28. To this end, the flip-flop includes upstream memory logic 32, which receives the data input and drives the first and second control lines. The upstream memory logic is configured to latch the input data on receiving the clock pulse. To this end, the upstream memory logic may include a clocked, sense-amplifier-type (SA) latch, as shown in FIG. 2. One benefit the SA latch offers is a very short $t_S$—0 picoseconds (ps) in some examples. It will be noted that the SA latch as a stand-alone memory circuit (in contrast to the configuration of FIG. 1) is typically not amenable to time borrowing.

In this and other embodiments, the selection logic is configured to expose a logic level dependent on whether the upstream memory logic has latched the input data. The exposed logic level is derived from the input data before the input data is latched, and from the latched input data after the input data is latched. In the embodiments considered herein, an output of the upstream memory logic reveals whether the input data is latched. That output is presented to the selection logic for the purpose of determining whether the input data is latched. In the embodiment of FIG. 1, the output of the upstream memory logic 32 includes first control line 26 and second control line 28. When the input data is latched, the first control line assumes the logic level of the input data, and the second control line is complementary to the first. When the input data is not latched, the first and second control lines are equal to each other—e.g., both assume a high logic level.

Continuing in FIG. 1, flip-flop 16 also includes downstream memory logic 34A that receives first control line 26 and second control line 28 and drives stored-data line 22. In the embodiment of FIG. 1, the downstream memory logic is an unclocked RS-type latch. It will be noted, however, that other suitable latches are contemplated as well. As shown in FIG. 1, upstream memory logic 32 is configured to present the latched input data to downstream memory logic 34A; the downstream memory logic is configured to present the stored, latched input data to selection logic 18A; and the selection logic is configured to present the exposed logic level at data output 14.

In memory circuit 10, receipt of clock pulse 12 triggers flip-flop 16 to store the logic level of data input 20. In general, such storing may be triggered by either edge of a clock pulse—i.e., a leading or trailing, rising or falling edge. For ease of description, it will be assumed hereinafter that flip-flop 16 is triggered to store the logic level of the data input on receiving a leading edge of the clock pulse.

With selection logic 18A configured as illustrated, data output 14 is driven to the logic level of data input 20 only when timing input 24 and each of the first and second control lines (26, 28) are high, and is driven otherwise to the logic level of stored-data line 22. The first and second control lines are maintained high prior to receipt of clock pulse 12—i.e., when the timing input is low. The BYP_SEL line is high under these conditions, but BYP_CLK is low. Accordingly, multiplexer 30 maintains the data output at the logic level of the most recently stored input data (whichever state is present at stored-data line 22). The logic level presented at the data output is held until receipt of the clock pulse in the selection logic. When the clock pulse is initially received—i.e., when the timing input goes high—the first and second control lines remain high momentarily, causing BYP_CLK to go high as well. As a result, multiplexer 30 switches the data output to the logic level of the data input. Due to buffer 36, the clock pulse is received in the selection logic before it is received in the upstream memory logic. Thus, the data output is driven to the logic level of the data input before the input data is stored in flip-flop 16, and more specifically, on receipt of the clock pulse in selection logic 18A.

Through buffer 36, clock pulse 12 is received, delayed, in upstream memory logic 32. The upstream memory logic is thereby triggered to latch the logic level of data input 20. This logic level then appears at first control line 26, while the complementary logic level appears at second control line 28. Latching causes the first and second control lines to be complements of each other, so that BYP_SEL and BYP_CLK are forced low. At this point, multiplexer 30 switches data output 14 to the logic level of the stored data at stored-data line 22. In this manner, the data output is driven to the logic level of the stored-data line as soon as the logic level of the input data is stored in flip-flop 16.

Figure 3:
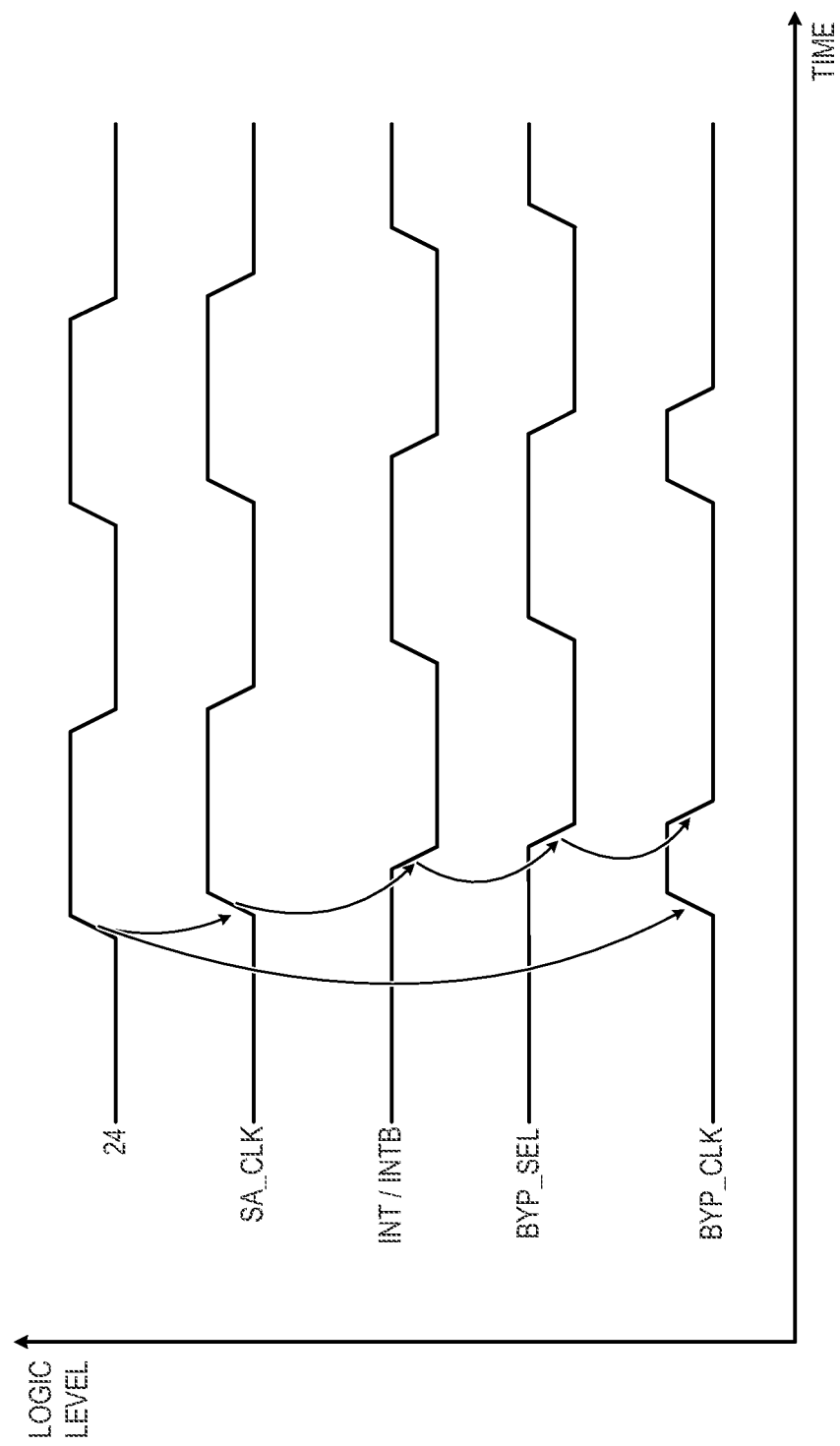
FIG. 3 is a qualitative timing chart showing the propagation of data through a memory circuit in accordance with an embodiment of this disclosure.

The timing chart of FIG. 3 shows in qualitative detail how the control signals are generated in memory circuit 10. The actual $t_{DQ}$ of this circuit, as well as the data-setup time $t_S$, is determined by the multiplexer delay. The overall $t_{DQ}$ in memory circuit 10 may be 30 ps or less, accordingly. In a traditional flip-flop, by contrast, $t_{DQ}$ would equal the sum of the propagation delays from two latch stages in series—60 to 80 ps, in some examples.

As noted above, flip-flop 16 is triggered by the leading edge of clock pulse 12 through buffer 36. The buffer causes the triggering of the flip-flop to be delayed relative to receipt of the clock pulse in the selection logic. The delay may be suitable in duration for softening the hard clock edge typically exhibited by an SA latch. Such softening enables time borrowing for clock skew and clock jitter absorption, and for averaging out within-die delay variations. In general, the amount of skew and jitter absorption may depend on the particulars of the clock-pulse distribution scheme. In one example, however, an absorption of 25 ps may be applied, effectively reducing $t_{DQ}$ from 30 ps to 5 ps.

Memory circuit 10 offers short $t_S$ and $t_{CQ}$, which combine to yield a short overall $t_{DQ}$. Furthermore, the circuit is amenable to time borrowing. The price paid for these benefits is a rather long data hold-time requirement $\tau_D$, which may be 70 ps in some examples. If the input data is changed after receipt of the clock pulse but before $\tau_D$, those changes will propagate directly through to the output, possibly causing a logic error. Accordingly, the disclosed memory circuit is most advantageous in throughput-limiting data paths where the input data is not susceptible to change within the $\tau_D$ interval.

No aspect of the foregoing description should be understood in a limiting sense, for numerous other embodiments are contemplated as well. The selection logic, for example, may be configured to receive the timing input and only one control line from the flip-flop. This adaptation could be accomplished trivially by incorporating AND gate 38 into flip-flop 16 instead of selection logic 18A. Other variants are contemplated in which the flip-flop is configured to drive a single control line that reflects whether the input data has or has not been stored.

Figure 4:
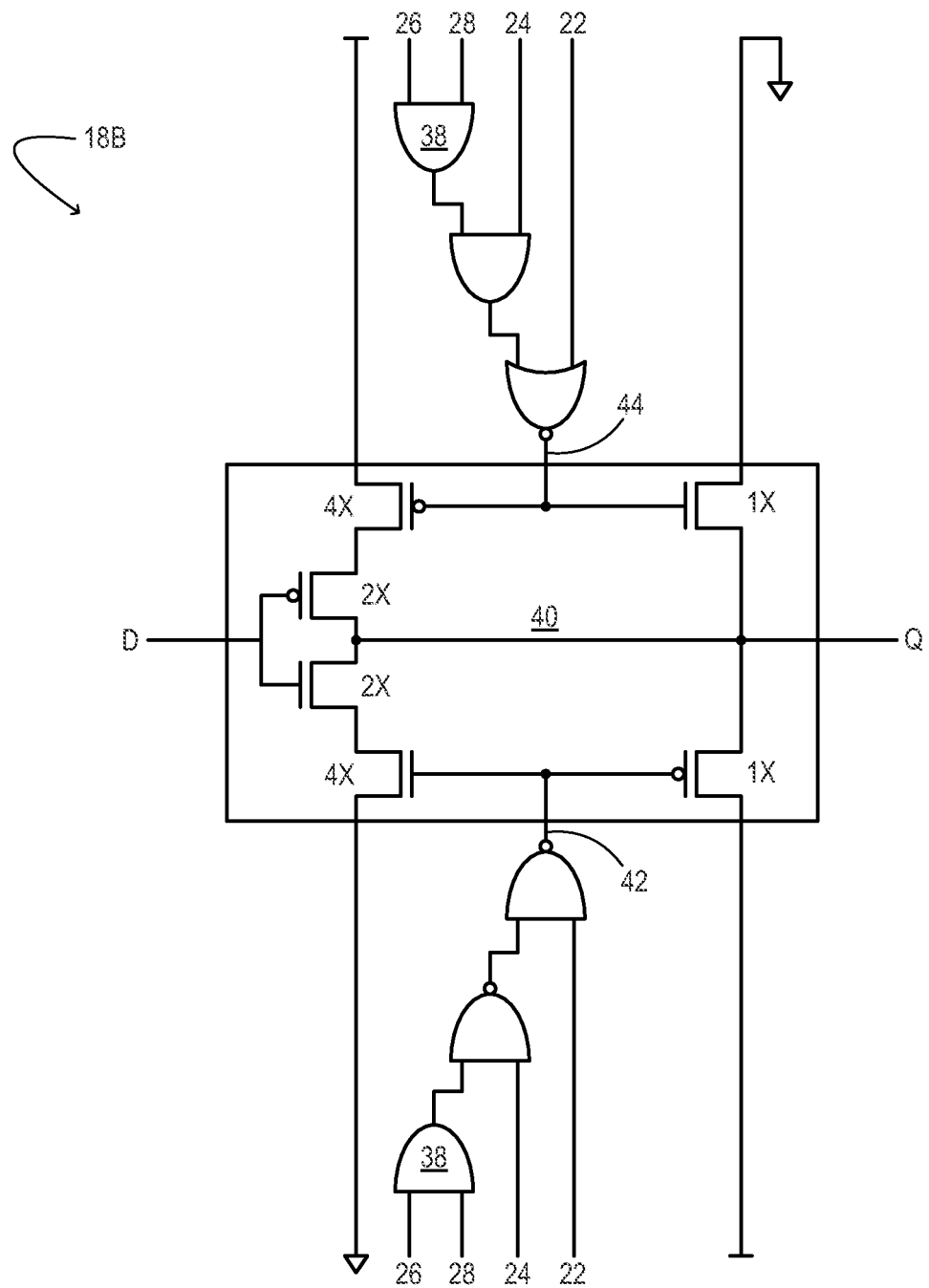
FIG. 4 schematically shows selection logic of a memory circuit in accordance with an embodiment of this disclosure.

Furthermore, the selection logic need not include a multiplexer. Instead of the multiplexer, it may include an inverting complex gate, as shown in FIG. 4. In the illustrated embodiment, inverting complex gate 40 is configured to receive, in addition to data input 20, an output-promoter input 42 and an output-demoter input 44, and to furnish data output 14. Selection logic 18B is configured such that the output-demoter input becomes high only when stored-data line 22 and at least one of timing input 24 and the first and second control lines (26, 28) are low. The output-promoter input becomes high only when the stored-data line is low or the timing input and each of the first and second control lines are high.

Thus, selection logic 18B is functionally analogous to selection logic 18A, but may offer an even shorter $t_{CQ}$ due to the decreased number of logic stages in the data-to-output path of inverting complex gate 40 relative to multiplexer 30.

In the embodiment shown in FIG. 4, inverting complex gate 40 is constructed from n- and p-channel metal-oxide-semiconductor field-effect transistors (MOSFETs) in a typical CMOS architecture. The designations 1×, 2×, and 4× indicate the relative width-to-length ratio or parallel redundancy of each MOSFET shown in the schematic, which directly relates to the ON conductance. In other words, the ON conductance of a 4×MOSFET is four times as great as that of a 1×MOSFET.

The speed advantage of inverting complex gate 40 is due largely to the fact that the signal from data input 20 need only propagate through a single transistor stage before arriving at data output 14. Despite the advantages of the illustrated embodiments, it will be understood that various other configurations, including other inverting complex-gate variants, are contemplated as well.

Figure 5:
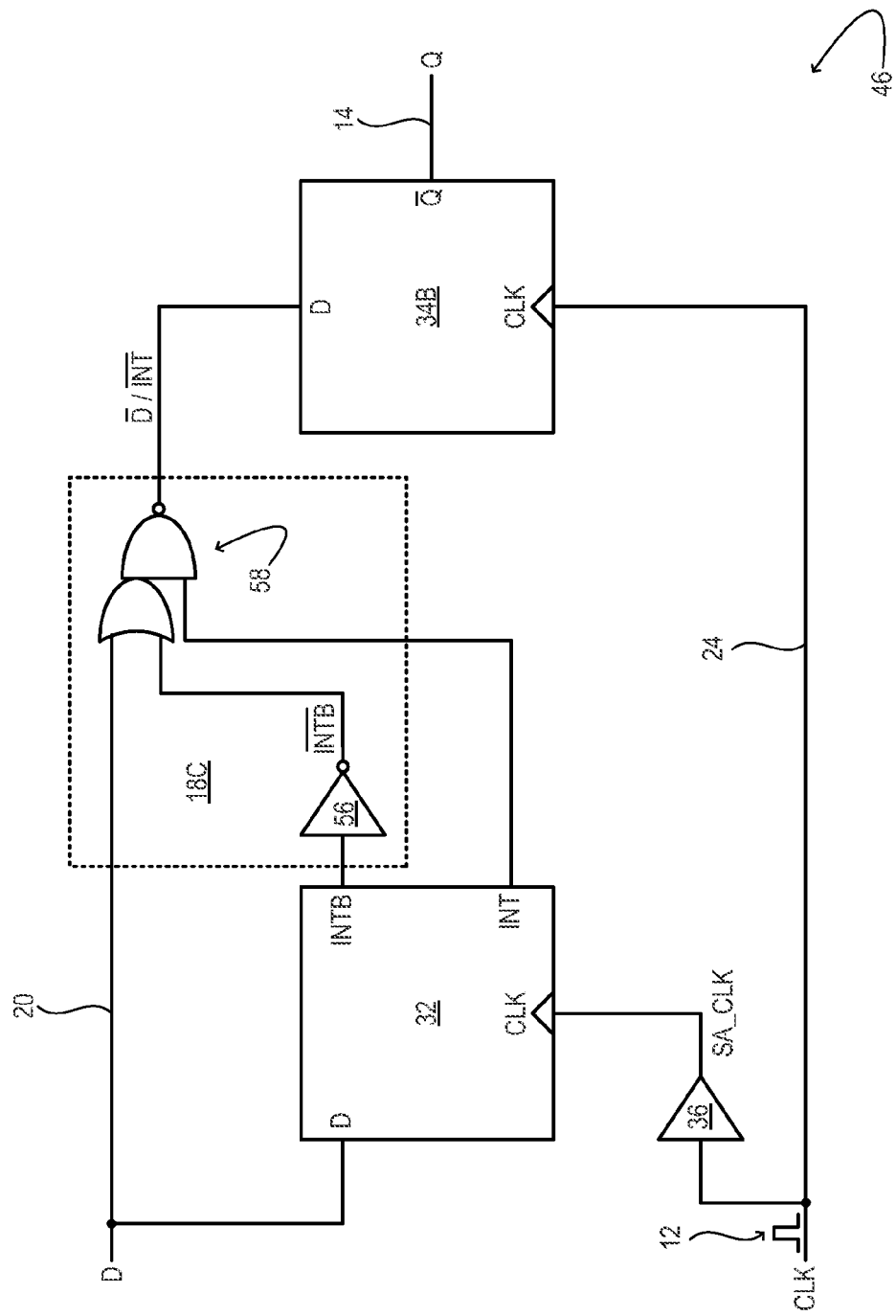
FIG. 5 schematically shows another non-transparent, fast-bypass memory circuit in accordance with an embodiment of this disclosure.

FIG. 5 schematically shows another fast-bypass memory circuit 46 in one embodiment. Like the memory circuits described above, memory circuit 46 includes upstream memory logic 32 and downstream memory logic 34B, with buffer 36 providing a clock-pulse delay to the upstream memory logic. Memory circuit 46 also includes selection logic 18C. In contrast to the selection logic of the above embodiments, selection logic 18C is arranged between the upstream and downstream memory logic. Selection logic 18C determines whether data input 20, on the one hand, or an output of upstream memory logic 32, on the other, is applied as input to downstream memory logic 34B.

In the embodiment shown in FIG. 5, upstream memory logic 32 is configured to present the latched input data to selection logic 18C; the selection logic is configured to present an exposed logic level to downstream memory logic 34B; and the downstream memory logic is configured to store the exposed logic level presented by the selection logic and to present the stored logic level at data output 14, on receiving clock pulse 12. As in the foregoing embodiments, the logic level exposed by the selection logic is dependent on whether the upstream memory logic has latched the input data. The exposed logic level is derived from the input data before the input data is latched, and from the latched input data after the input data is latched.

The schematic diagram of FIG. 6 shows aspects of example downstream memory logic 34B in one embodiment. In FIG. 6, the downstream memory logic is a clocked latch. Inverted output ~Q of the downstream memory logic drives data output 14 of the memory circuit. Downstream memory logic 34B includes a MOSFET data-input stage 48 enabled by complementary clock-pulse signals, CLK and ~CLK. The data-input stage feeds into latch 50, which includes inverters 52 and 54. Inverter 54 is enabled by the inverted clock pulse ~CLK. As shown in FIG. 6, the output of the latch feeds inverter 55, which presents the inverted data output ~Q.

In the embodiment illustrated in FIG. 5, selection logic 18C includes inverter 56 and and-or-invert (AOI) structure 58. The schematic diagram of FIG. 7 shows aspects of an example AOI structure 58 in one embodiment. The illustrated AOI structure includes a MOSFET input stage 60 and MOSFET output stage 62.

Returning now to FIG. 5, the INT and INTB outputs of upstream memory logic 32 are maintained high prior to receipt of clock pulse 12 through buffer 36. Thus, ~INTB is low. Under these conditions, the D input of downstream memory logic 34B is set to the inverse of the logic level of data input 20. However, the stored logic level presented at the data output is held until receipt of the clock pulse in the downstream memory logic. The arrival of clock pulse 12 at the CLK input of the downstream memory logic causes the inverse logic level of the input data to be stored in the downstream memory logic. Because the chosen data output 14 is the inverting output ~Q of the downstream memory logic, the logic level presented at data output 14 is twice inverted (i.e., non-inverted) relative to the logic level received at the data input.

Buffer 36 is configured to delay receipt of clock pulse 12 in upstream memory logic 32 relative to receipt of the clock pulse in downstream memory logic 34B. When clock pulse 12 is received in the upstream memory logic, after the preselected delay, the input data is stored in the upstream memory logic. At this point, the INT and INTB outputs become complements of each other, with INT and ~INTB both assuming the logic level of the stored input data. Under these conditions, the D input of downstream memory logic 34B is set to the inverse of the stored input data. Again, because data output 14 is the inverting output of the downstream memory logic, the logic level presented at data output 14 is non-inverted relative to the logic level stored in the upstream memory logic.

An advantage of memory circuit 46 relative to memory circuit 10 of FIG. 1 is a reduction in the hold-time requirement $\tau_D$. In memory circuit 10, data flows from the INT node and through the NAND gates of downstream memory logic 34A to stored-data node 22. In parallel, INT and INTB flow through selection logic 18A to generate BYP_CLK. To avoid errors, the delay to BYP_CLK must be long enough to guarantee that the stored-data node has settled down to the desired value. In other words, some time margin must be provided after the stored-data node has switched, but before multiplexer 30 can switch. Only after the multiplexer has switched is D again free to toggle. The reduction in the $\tau_D$ of memory circuit 46, relative to that of memory circuit 10, is effectively the delay of the NAND gates, plus the desired margin for the stored-data node to settle, minus the delay of inverter 56—30 to 40 ps in some examples.

A disadvantage of memory circuit 46 relative to memory circuit 10 is a slight increase in $t_{DQ}$. In memory circuit 10, $t_{DQ}$ is simply the delay through multiplexer 30, which may include a first inverter, followed by a transfer gate, followed by a second inverter. In memory circuit 46, the first inverter is replaced, effectively by AOI structure 58. Because the AOI structure is stacked, it may be slower than an inverter. Accordingly, the increase in $t_{DQ}$ is the difference between the delay through the AOI structure relative to the delay through an inverter—5 ps in some examples.

Figure 8:
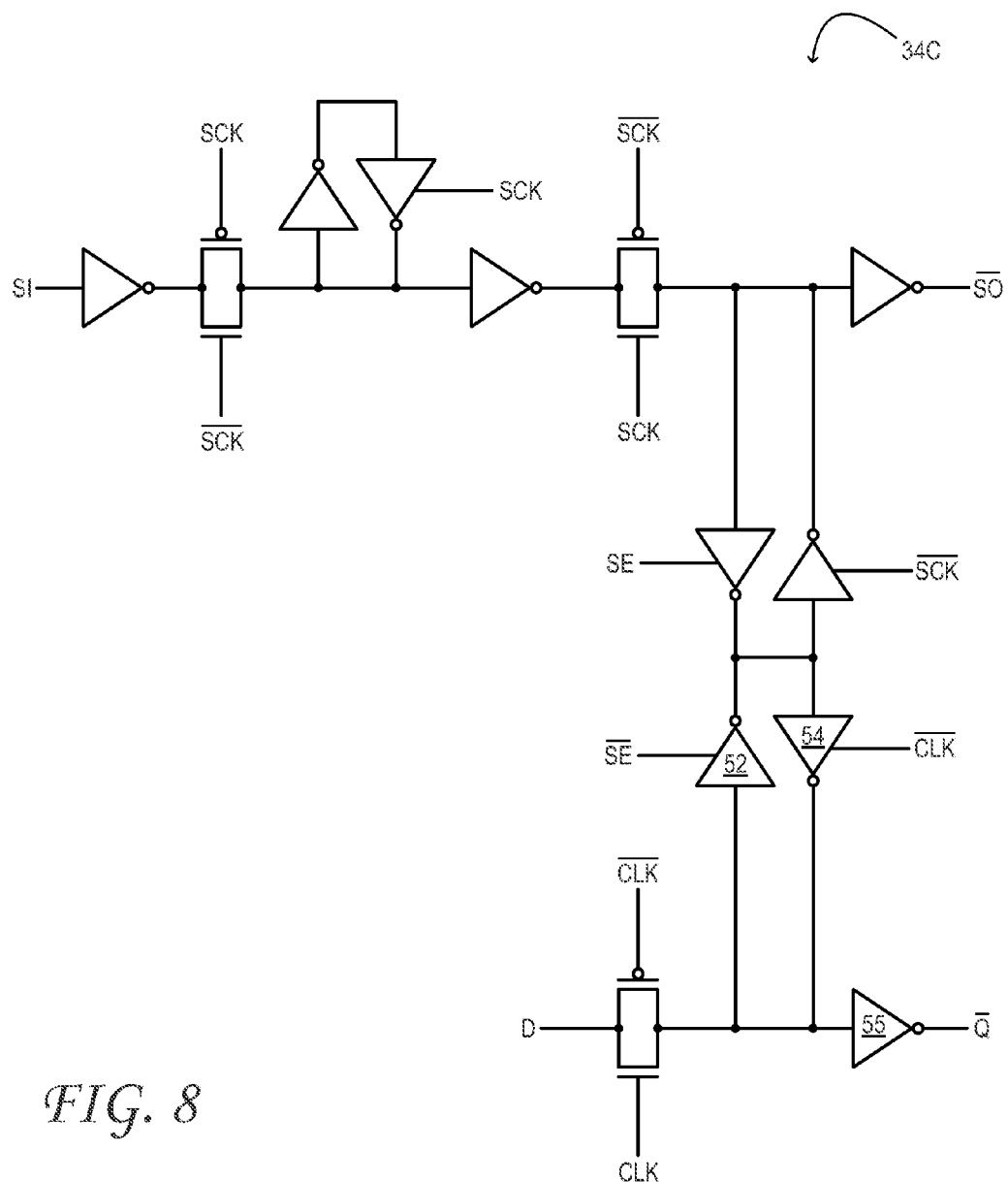
FIG. 8 schematically shows downstream memory logic in accordance with another embodiment of this disclosure.

The schematic diagram of FIG. 8 shows aspects of downstream memory logic 34C, which is a scan-testable variant of the downstream memory logic of FIG. 6. In normal operation, the scan-enable (SE) and scan-shift clock (SCK) lines are low, so the circuit operates in the same way as downstream memory logic 34B. During the scan test, however, the clock (CLK) is initially halted low, so that the latch structure upstream of ~Q holds the data. When SE goes high, that data is then held by the complementary latch structure upstream of the scan-shift output ~SO. This event is referred to as 'scan capture'. Then the scan clock toggles to enact scan shift. When the scan shift is done, SCK is halted low and SE goes low again. This causes the data just shifted in to be held by the latch structure upstream of ~Q. The circuit is then free to resume normal operation. It will be appreciated that the scan-test capability of downstream memory logic 18C has essentially no impact on normal operation.

Figure 9:
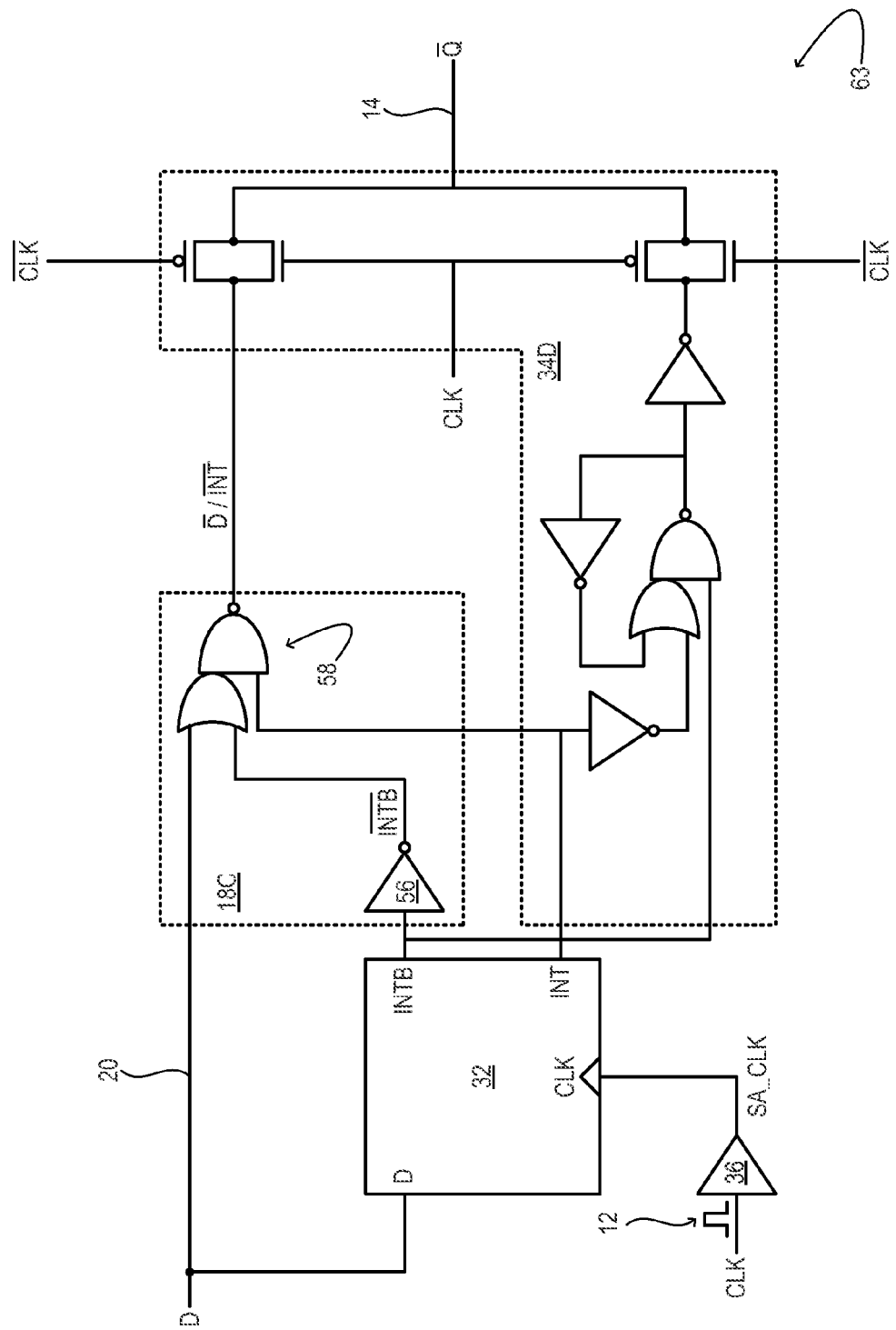
FIG. 9 schematically shows another non-transparent, fast-bypass memory circuit in accordance with an embodiment of this disclosure.

FIG. 9 schematically shows another fast-bypass memory circuit 63 in one embodiment. This circuit is similar to memory circuit 46 of FIG. 5, but it includes somewhat different downstream memory logic 34D. Significantly, this design eliminates output inverter 55. Omission of the output inverter may further shorten $t_{DQ}$ by about 10 ps, but at the expense of drive strength and of a somewhat larger footprint.

The configurations described above enable various methods to present input data at a data output of a memory circuit promptly on receiving a clock pulse in the memory circuit. Accordingly, some such methods are now described, by way of example, with continued reference to the above configurations. It will be understood, however, that the methods here described, and others within the scope of this disclosure, may be enabled by different configurations as well. The methods may be entered upon any time the memory circuit is operating, and may be executed repeatedly. Further, some of the process steps described and/or illustrated herein may, in some embodiments, be omitted without departing from the scope of this disclosure. Likewise, the indicated sequence of the process steps may not always be required to achieve the intended results, but is provided for ease of illustration and description. One or more of the illustrated actions, functions, or operations may be performed repeatedly, depending on the particular strategy being used.

Figure 10:
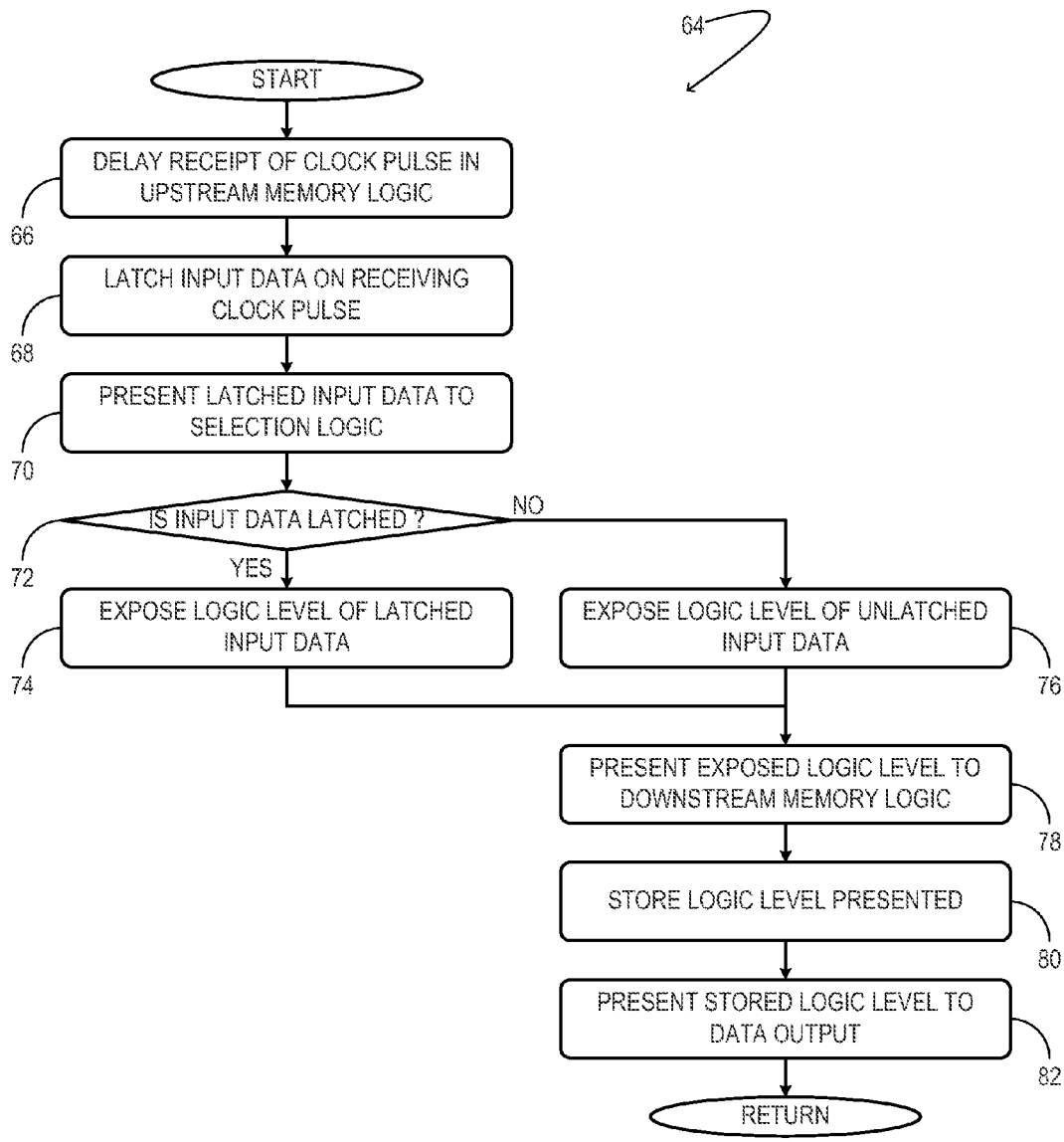
FIG. 10 illustrates a method to present input data at a data output of a memory circuit in accordance with an embodiment of this disclosure.

FIG. 10 illustrates an example method 64 to present input data at a data output of a memory circuit promptly on receiving a clock pulse in the memory circuit. At 66 of method 64, receipt of a clock pulse in the upstream memory logic is delayed. The delay may be effected by a buffer coupled upstream of the CLK input of the upstream memory logic. At 68 the input data provided to the memory circuit is latched on receiving the clock pulse in the upstream memory logic. At 70 the latched input data of the upstream memory logic is presented to selection logic of the memory circuit. At 72 it is determined, based on an output of the memory circuit, whether the input data is latched. If the input data is latched, then the method advances to 74, where the selection logic of the memory circuit exposes the logic level of the latched input data. However, if the input data is not latched, then the method advances to 76, where the selection logic of the memory circuit exposes the logic level of the unlatched input data. In this manner, the selection logic exposes a logic level derived from the input data before the input data is latched in the upstream memory logic, and a logic level derived from the latched input data after the input data is latched in the upstream memory logic.

At 78 the exposed logic level of the selection logic is presented to downstream memory logic. At 80 the exposed logic level presented by the selection logic is stored in the downstream memory logic. At 82 the logic level stored in the downstream memory logic is presented to data output on receipt of the clock pulse. From 82 the method returns.

Figure 11:
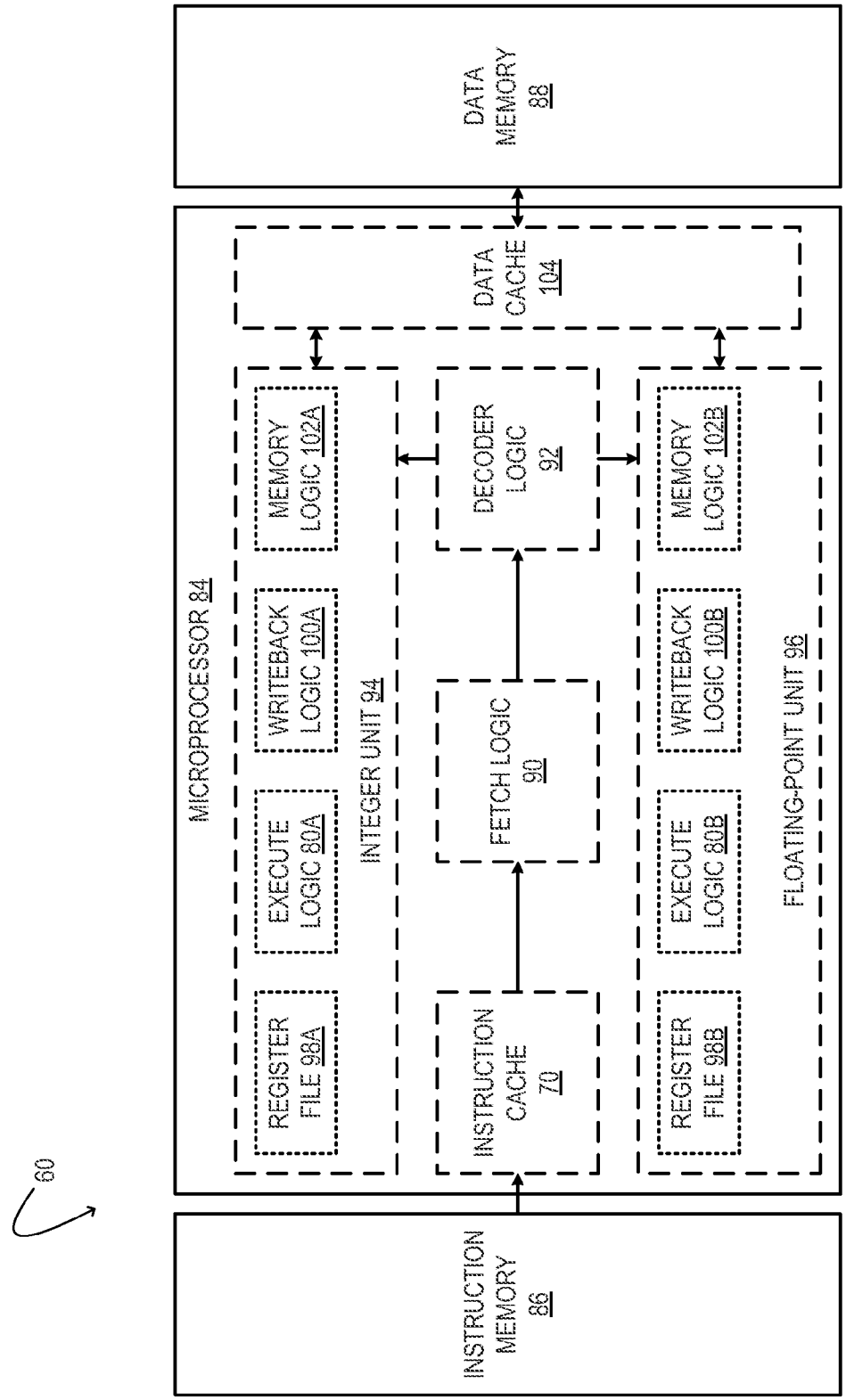
FIG. 11 schematically shows a processing environment in accordance with an embodiment of this disclosure.

As noted above, the memory circuits described herein may be used to an advantage in logic paths where a very short $t_{DQ}$ is desired, and an acceptably long $\tau_D$ is available. Such paths exist in numerous, varied environments in IC microarchitecture. One example environment is illustrated in FIG. 11. This drawing schematically shows processing environment 60—a central processing unit or graphics processing unit of a personal computer, game system, or smartphone, for example. Environment 60 includes microprocessor 84 operatively coupled to instruction memory 86 and to data memory 88. Embodied in random-access memory of any suitable variant, the instruction and data memories may correspond to different physical memory structures or to different parts of the same physical memory structure.

Microprocessor 84 includes substructures 90 through 104, in addition to numerous control and interconnect structures not shown in FIG. 11. In particular, the microprocessor includes fetch logic 90 configured to read from instruction cache 70 a sequence of instructions stored in and retrieved from instruction memory 86. The fetch logic is further configured to dispatch the sequence of instructions to decoder logic 92. The decoder logic decodes the instructions by parsing op-codes, operands, and addressing modes, for example. Once parsed, the instructions are executed by integer unit 94 and/or floating-point unit 96.

In the embodiment shown in FIG. 11, integer unit 94 includes a register file 98A, execute logic 80A, write-back logic 100A, and memory logic 102A. Floating-point unit 96 includes a separate register file 98B and separate execute, write-back, and memory logic. In other embodiments, at least some of these structures may be shared between the integer and floating-point units. When the instructions are executed, a sequence of logical and/or arithmetic results evolve in the execute logic of one or both units. The corresponding writeback logic stores such results in an appropriate register of the corresponding register file. In some architectures, the memory logic has the exclusive task of enacting store and load operations to and from data memory 88, via data cache 104. Although environment 60 shows only one processing core, every aspect of this disclosure is equally consistent with multi-core processors and environments.

Virtually any of the microprocessor substructures 90 through 104 may include logic paths that can potentially limit overall data throughput. In such paths, a non-transparent, fast-bypass memory circuit may be used to an advantage. For example, memory circuit 10 or 46 may be used in decoder logic 92, execute logic 80A/B, and/or writeback logic 100A/B.

Another use for memory circuits 10 or 46 in the various substructures of microprocessor 84 may be to reduce the effects of clock jitter and clock skew. Clock jitter refers to the inherent period-length variation of the pulse train from a clock; it may result from various environmental factors. Clock skew is a scenario in which different microprocessor substructures receive imperfectly synchronized clock pulses due to so-called within-die (WID) delay variations. Some WID delay variations can result from nonidealities in fabrication—geometric and/or material inconsistencies that affect signal-path impedances, for example. Other delay variations are merely the result of the clock pulse having to travel different distances to reach the various substructures of the microprocessor.

Figure 12:
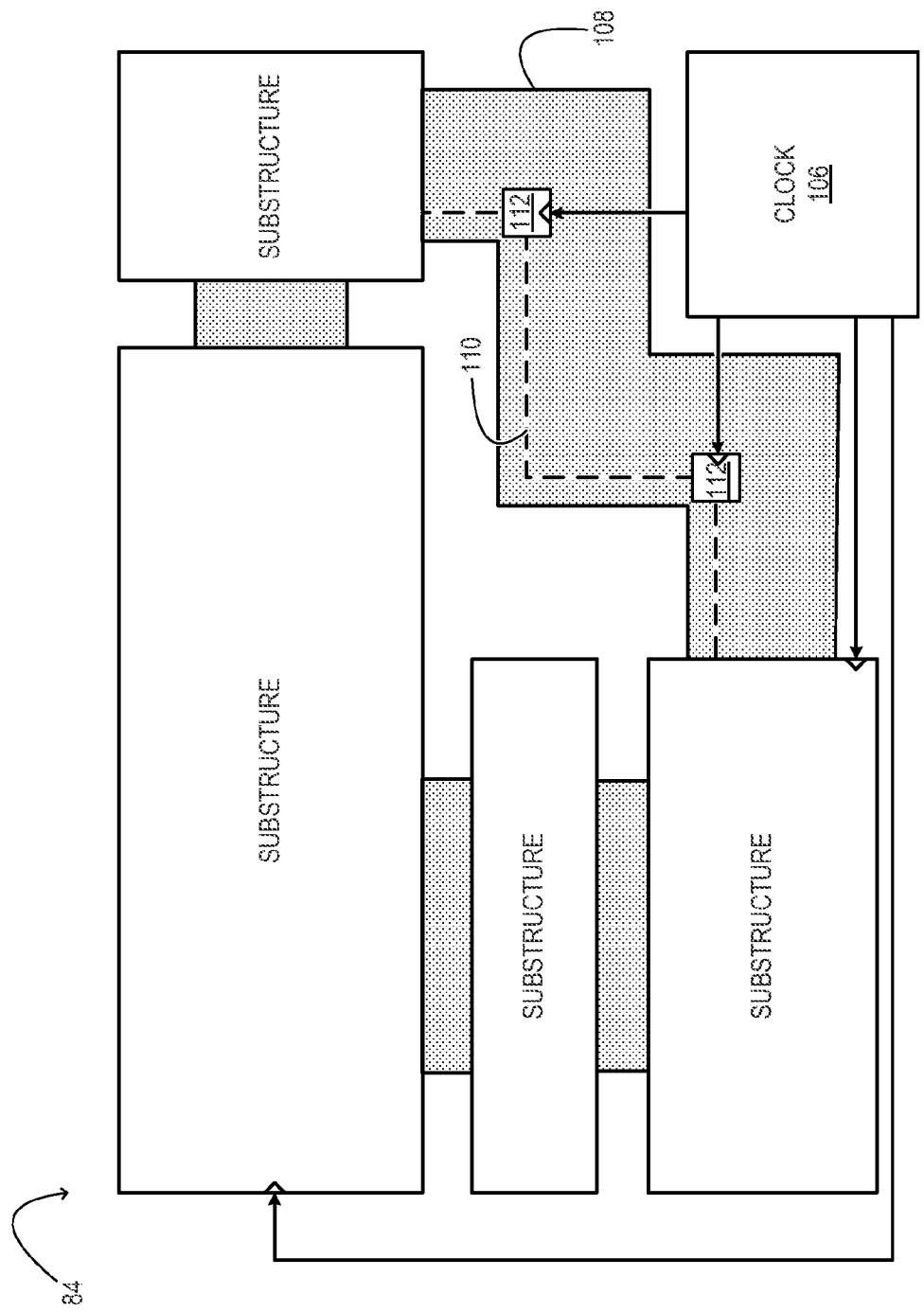
FIG. 12 is a highly schematic view of a microprocessor in accordance with an embodiment of this disclosure.

FIG. 12 illustrates this point. The drawing shows, as unshaded rectangular boxes, an example layout of substructures (any of substructures 90 through 104, for example) in a portion of microprocessor 84. The drawing also shows clock 106, which transmits a clock pulse to at least some of the substructures over signal paths of unequal length. Returning again to FIG. 1, the reader is reminded that upstream memory logic 32 is triggered to latch the logic level of the input data on receiving clock pulse 12, and that the clock pulse is received into the upstream memory logic through buffer 36. As noted hereinabove, the buffer may be configured to delay the clock pulse by an amount suitable to effect time borrowing in multi-cycle interconnect 108, in order to reduce the effects of clock skew and clock jitter in microprocessor 84. For instance, a jitter event may result in a clock edge arriving earlier than expected at the clock input of a given memory circuit. As a result, the data-setup time $t_S$ is effectively lengthened, leaving less time for the logic state at the data input to be set up. By delaying the arrival of the clock edge to upstream memory logic 32 with buffer 36, it can be ensured that the data input has adequate time to set up, and that the memory circuit stores the correct logic level of the data input. Notably, with the configurations disclosed herein, this extra buffer delay will not increase $t_{DQ}$, since the output, prior to latching, propagates directly from data input 20, not from the upstream memory logic.

The memory circuits described herein may also be used in so-called repeater-type interconnects that carry data signals among the various substructures of microprocessor 84. This aspect is illustrated with further reference to FIG. 12. The interconnects are shown in this drawing as shaded regions.

Interconnect 108, in particular, is configured to carry data between two substructures of microprocessor 84. This interconnect includes a monodirectional signal path 110 through which a data signal is carried over a conductor or series of conductors. In some embodiments, an interconnect may include a bidirectional signal path—e.g., two antiparallel, monodirectional signal paths. In still other embodiments, an interconnect may include virtually any multiplicity of monodirectional or bidirectional signal paths-64 bidirectional signal paths, for example, for bidirectional exchange of 64-bit data between substructures of the microprocessor.

As illustrated in FIG. 12, signal path 110 may be shorter than some signal paths that carry data to the same substructure, and longer than others. The difference in the geometric lengths of the various signal paths could potentially result in asynchronous arrival of previously synchronized data into a substructure, as could WID delay variations that result from fabrication inconsistencies. To better synchronize the arrival of data into the various microprocessor substructures, interconnect 108 and other interconnects of microprocessor 84 may be repeater-based interconnects, in which every signal path includes at least one clocked memory stage 112, through which a data signal is actively driven. In some embodiments, some or all of the repeater-based interconnects may be multi-cycle repeater-based interconnects, in which every signal path includes two or more clocked memory stages arranged in series. In this configuration, a data signal toggles through each clocked memory stage in sequence, driven by the synchronized clock pulses received therein.

Figure 13:
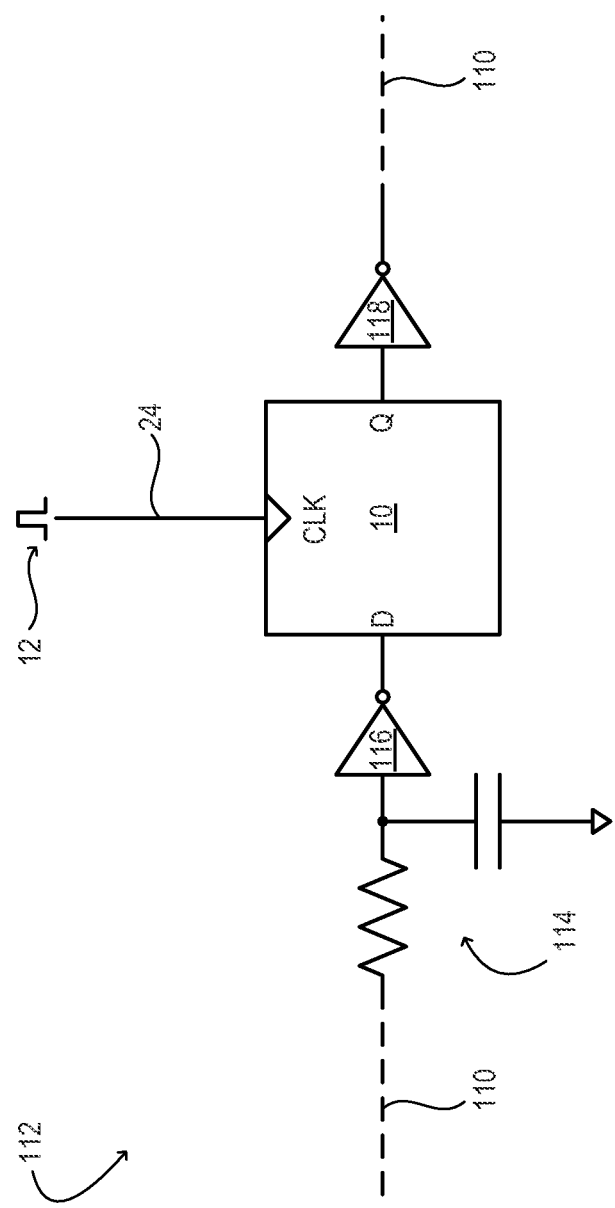
FIG. 13 schematically shows a clocked memory stage suitable for use in a repeater-based interconnect in accordance with an embodiment of this disclosure.

FIG. 13 schematically shows one example of a clocked memory stage 112 suitable for use in multi-cycle repeater-based interconnect 108. In this circuit, data is driven through signal path 110 from left to right in the drawing, first through low-pass filter stage 114 and then through inverting buffer 116. From inverting buffer 116, the data is applied in inverted form to the D input of a memory circuit. The memory circuit also receives clock pulse 12. Promptly on receipt of the clock pulse, the data logic level received at the D input appears at data output Q, as described hereinabove. Clocked memory stage 112 also includes inverting buffer 118 coupled to data output Q. The signal from data output Q is received in inverting buffer 118, which drives signal path 110 to the same data logic level as was received at input D, in synchronicity with clock pulse 12.

Referring again to FIGS. 1 and 5, and to the discussion above, buffer 36 may be configured to delay the clock pulse by an amount suitable to effect time borrowing in multi-cycle interconnect 108, in order to average out within-die delay variations in the various segments of the interconnect.

It will be understood, finally, that the circuits and methods described hereinabove are embodiments of this disclosure—non-limiting examples for which numerous variations and extensions are contemplated as well. Accordingly, this disclosure includes all novel and non-obvious combinations and sub-combinations of the such circuits, as well as any and all equivalents thereof.

The invention claimed is:

1. A memory circuit that presents input data at a data output promptly on receiving a clock pulse, the circuit comprising:
   upstream memory logic configured to latch the input data on receiving the clock pulse;
   downstream memory logic configured to store the latched input data; and
   selection logic configured to indicate whether the upstream memory logic has latched the input data.

2. The memory circuit of claim 1 further comprising a buffer through which the clock pulse is received, delayed, in the upstream memory logic.

3. The memory circuit of claim 1 where the upstream memory logic comprises a clocked, sense-amplifier-type latch.

4. The memory circuit of claim 1 where an output of the upstream memory logic reveals whether the input data is latched, and where that output is presented to the selection logic.

5. The memory circuit of claim 4 where the output of the upstream memory logic includes first and second control lines complementary to each other when the input data is latched, and equal to each other when the input data is not latched, and where the first control line assumes the logic level of the input data when the input data is latched.

6. The memory circuit of claim 1 where the upstream memory logic, the downstream memory logic, and the selection logic are fabricated from complementary metal-oxide-semiconductor elements.

7. The memory circuit of claim 1 where the upstream memory logic is configured to present the latched input data to the selection logic, where the selection logic is configured to present the exposed logic level to the downstream memory logic, and where the downstream memory logic is configured to store the logic level exposed by the selection logic and to present the stored logic level at the data output.

8. The memory circuit of claim 7 where the clock pulse is received in the downstream memory logic before it is received in the upstream memory logic.

9. The memory circuit of claim 1 where the downstream memory logic is a clocked latch, and where an inverted output of the downstream memory logic drives the data output.

10. The memory circuit of claim 1 where the selection logic includes an inverter and an and-or-invert structure.

11. The memory circuit of claim 1 where the stored logic level presented at the data output is held until receipt of the clock pulse in the downstream memory logic.

12. The memory circuit of claim 1 where the upstream memory logic is configured to present the latched input data to the downstream memory logic, where the downstream memory logic is configured to present the stored, latched input data to the selection logic, and where the selection logic is configured to present the exposed logic level at the data output.

13. The memory circuit of claim 12 where the clock pulse is received in the selection logic before it is received in the upstream memory logic.

14. The memory circuit of claim 12 where the upstream memory logic and the downstream memory logic are coupled in a flip-flop.

15. The memory circuit of claim 12 where the selection logic includes one of a multiplexer and an inverting complex gate.

16. The memory circuit of claim 12 where the exposed logic level presented at the data output is held until receipt of the clock pulse in the selection logic.

17. A method to present input data at a data output of a memory circuit promptly on receiving a clock pulse in the memory circuit, the method comprising:
   delaying receipt of the clock pulse in upstream memory logic of the memory circuit;
   latching the input data in the upstream memory logic on receiving the clock pulse in the upstream memory logic; and
   in a selection logic of the memory circuit, exposing a logic level derived from the input data before the input data is latched in the upstream memory logic, and, exposing a logic level derived from the latched input data after the input data is latched in the upstream memory logic.

18. The method of claim 17 further comprising:
   presenting the latched input data of the upstream memory logic to the selection logic;
   presenting the exposed logic level of the selection logic to the downstream memory logic;
   storing the logic level exposed by the selection logic in downstream memory logic; and
   presenting the stored logic level of the downstream memory logic to the data output.

19. The method of claim 17 further comprising determining based on an output of the upstream memory logic whether the input data is latched.

20. A memory circuit that presents input data at a data output promptly on receiving a clock pulse, the circuit comprising:
   upstream memory logic configured to latch the input data on receiving the clock pulse;
   selection logic configured to expose a logic level dependent on whether the upstream memory logic has latched the input data, the exposed logic level derived from the input data before the input data is latched, and from the latched input data after the input data is latched;
   downstream memory logic configured to store the logic level exposed by the selection logic and to present the stored logic level at the data output on receiving the clock pulse; and
   a buffer configured to delay receipt of the clock pulse in the upstream memory logic relative to receipt of the clock pulse in the downstream memory logic.

* * * * *